United States Patent
Edelen et al.

(10) Patent No.: US 9,419,475 B2
(45) Date of Patent: Aug. 16, 2016

(54) UPS SYSTEMS WITH MODULAR BLOCK ARCHITECTURES

(75) Inventors: Daniel Ray Edelen, Clayton, NC (US); Stacy Lee Frye, Raleigh, NC (US); Kinston DeVol Williams, Apex, NC (US)

(73) Assignee: Eaton Corporation, Cleveland, OH (US)

( * ) Notice: Subject to any disclaimer, the term of this patent is extended or adjusted under 35 U.S.C. 154(b) by 991 days.

(21) Appl. No.: 13/593,321

(22) Filed: Aug. 23, 2012

(65) Prior Publication Data

US 2014/0054964 A1 Feb. 27, 2014

(51) Int. Cl.
| H02J 7/00 | (2006.01) |
| H02J 9/00 | (2006.01) |
| H02J 9/06 | (2006.01) |
| H05K 7/14 | (2006.01) |

(52) U.S. Cl.
CPC ............. *H02J 9/062* (2013.01); *H05K 7/1492* (2013.01); *Y02P 80/11* (2015.11); *Y10T 307/62* (2015.04)

(58) Field of Classification Search
CPC ...... H02J 9/062; H05K 7/1492; Y10T 307/62
USPC .................................................... 307/64–66
See application file for complete search history.

(56) References Cited

U.S. PATENT DOCUMENTS

| 6,205,029 | B1 * | 3/2001 | Byrne et al. ................ 361/724 |
| 6,317,348 | B1 * | 11/2001 | Vackar ........................ 363/144 |
| 7,265,458 | B2 * | 9/2007 | Edelen et al. ................ 307/65 |
| 2005/0162836 | A1 * | 7/2005 | Briggs et al. ................ 361/724 |
| 2005/0200205 | A1 * | 9/2005 | Winn et al. ................... 307/64 |
| 2006/0167569 | A1 * | 7/2006 | Colombi et al. .............. 700/22 |
| 2007/0037420 | A1 * | 2/2007 | Ohman ........................ 439/108 |
| 2007/0217125 | A1 * | 9/2007 | Johnson ....................... 361/600 |
| 2008/0144245 | A1 * | 6/2008 | Fuchik et al. ................ 361/63 |
| 2009/0150818 | A1 * | 6/2009 | Bakhreiba et al. ........... 715/771 |

(Continued)

FOREIGN PATENT DOCUMENTS

| WO | WO 2010/097787 | A1 | 9/2010 | |
| WO | WO 2010097787 | A1 * | 9/2010 | ............... H05K 7/14 |

OTHER PUBLICATIONS

International Preliminary Report on Patentability Corresponding to International Application No. PCT/US2013/056170; Date of Mailing: Mar. 5, 2015; 10 Pages.

(Continued)

*Primary Examiner* — Carlos Amaya
(74) *Attorney, Agent, or Firm* — Myers Bigel & Sibley, P.A.

(57) ABSTRACT

A UPS system includes a power distribution assembly having a plurality of side faces and comprising an AC input and an AC output and at least two UPS assemblies having respective side faces confronting respective ones of the side faces of the power distribution assembly, each of the at least two UPS assemblies comprising a plurality of converter modules and an interconnection module configured to switchably couple AC inputs and AC outputs of the converter modules to respective ones of the AC input and the AC output of the power distribution assembly through conductors passing through the confronting side faces. The conductors may couple the power distribution assembly to the at least two UPS modules without the use of conduit and/or cable trays.

18 Claims, 8 Drawing Sheets

(56) References Cited

U.S. PATENT DOCUMENTS

2010/0102636 A1\* 4/2010 Tracy et al. ............... 307/80
2010/0109438 A1\* 5/2010 Scoggins et al. ........... 307/66
2012/0170175 A1   7/2012 Silberbauer et al.
2013/0069432 A1\* 3/2013 Beg et al. ................. 307/64
2013/0187467 A1\* 7/2013 Chen et al. ............... 307/64

OTHER PUBLICATIONS

Notification of Transmittal of the International Search Report and the Written Opinion of the International Searching Authority, or the Declaration, PCT/US2013/056170, Date of Mailing: Nov. 28, 2013, 14 pages.

\* cited by examiner

UPS SYSTEMS WITH MODULAR BLOCK ARCHITECTURES

BACKGROUND

The inventive subject matter relates to uninterruptible power supply (UPS) systems and, more particularly, to modular UPS systems.

UPS systems are commonly used in installations such as data centers, medical centers and industrial facilities. UPS systems may be used in such installations to provide backup power to maintain operation in event of failure of the primary utility supply. These UPS systems commonly have an "online" configuration including a rectifier and inverter coupled by a DC link that is also coupled to an auxiliary power source, such as a battery, fuel cell or other energy storage device. Other UPS systems may use standby, line-interactive or other circuit topologies.

UPS systems may include one or more modular UPS assemblies. Each assembly may include multiple UPS modules, each of which may include, for example, a rectifier, an inverter and a DC/DC converter for interfacing to a battery. The UPS modules may be mounted in a common chassis, along with control and interface circuitry, such as bypass switches and the like. The UPS modules commonly are designed to operate in parallel to provide scalable power capacity, e.g., the modules may be coupled in common to an AC source, a DC source (e.g., a battery) and/or a load. An example of a modular UPS assembly is the Eaton® Power XPert 9395 UPS described at powerquality.eaton.com.

In large scale applications, such as data centers, multiple ones of such UPS assemblies are often individually mounted and wired to a central paralleling system using external conduits or wiring trays. Such arrangements may be expensive and time-consuming to install and difficult to expand.

SUMMARY

Some embodiments of the inventive subject matter provide a UPS system including a power distribution assembly having a plurality of side faces and comprising an AC input and an AC output and at least two UPS assemblies having respective side faces confronting respective ones of the side faces of the power distribution assembly, each of the at least two UPS assemblies comprising a plurality of converter modules and an interconnection module configured to switchably couple AC inputs and AC outputs of the converter modules to respective ones of the AC input and the AC output of the power distribution assembly through conductors passing through the confronting side faces. The conductors may couple the power distribution assembly to the at least two UPS modules without the use of external wiring, such as conduit and/or cable trays.

In some embodiments, the at least two UPS assemblies may extend perpendicularly from opposite sides of the power distribution assembly. The at least two UPS assemblies may include at least two pairs of UPS assemblies extending from opposite sides of the power distribution assembly.

In some embodiments, each converter module may include a rectifier circuit and an inverter circuit coupled to the AC input and the AC output, respectively, of the converter module. Each interconnection module may include respective first and second circuit breakers configured to switchably couple the AC inputs and AC outputs of the associated converter modules to respective ones of the AC input and the AC output of the power distribution assembly. The interconnection modules may also each include a static bypass switch.

Further embodiments provide an apparatus including a cubiform power distribution assembly comprising an AC input, an AC output and at least two side faces configured to confront side faces of respective ones of at least two UPS assemblies and configured to couple the AC input and the AC output to the at least two UPS modules through the confronting faces. The power distribution assembly may be configured to couple the AC input and the AC output to the at least two UPS modules using conductors passing through the confronting faces. The at least two side faces of the power distribution assembly may be configured such that the at least two UPS assemblies extend perpendicularly from opposite sides of the power distribution assembly. The at least two side faces of the power distribution assembly may include at least two pairs of side faces configured to confront at least two pairs of UPS assemblies on opposite sides of the power distribution assembly.

Further embodiments provide a UPS system including a power distribution assembly comprising at least one cubiform enclosure having a plurality of side faces and at least two UPS assemblies, each comprising at least one cubiform enclosure having a side face configured to confront a side face of the power distribution assembly. Each of the least two UPS assemblies includes a plurality of converter modules and an interconnection module configured to switchably couple AC inputs and AC outputs of the converter modules to respective ones of an AC input and an AC output of the power distribution assembly through conductors passing through the confronting side faces. The distribution assembly and the at least two UPS assemblies may be configured to support AC connection of the distribution assembly to the at least two UPS assemblies without the use of external AC wiring, such as wiring in conduit and/or cable trays.

DETAILED DESCRIPTION

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Figure 1:
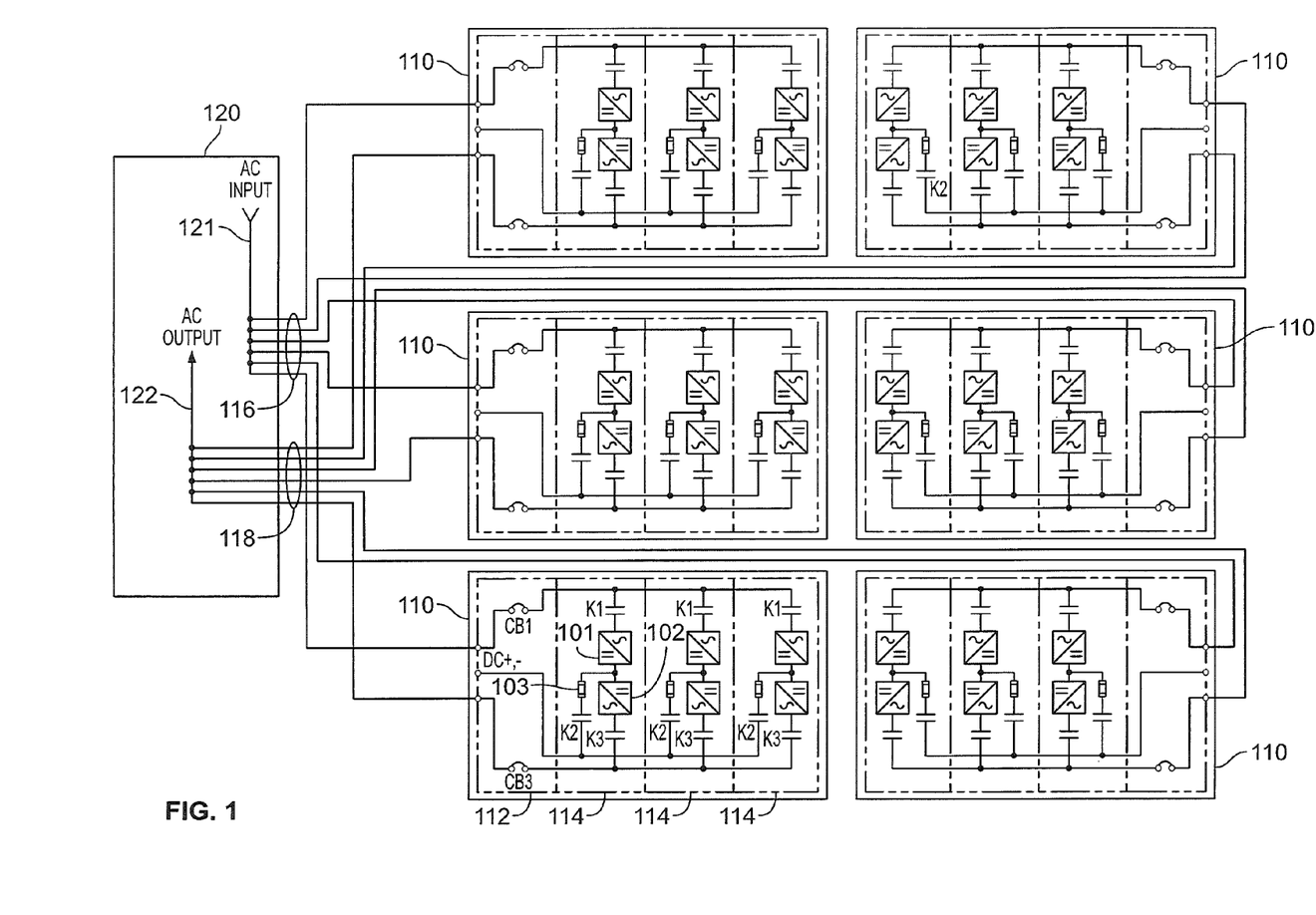
FIG. 1 is a schematic diagram illustrating a UPS system according to some embodiments of the inventive subject matter.

FIG. 1 is a schematic diagram of a UPS system according to some embodiments of the inventive subject matter. The UPS system includes one or more UPS assemblies 110, which are configured to be coupled to a distribution assembly 120. The distribution assembly 120 includes an AC input 120 connected to conductors 116 coupled to the AC inputs of the power UPS assemblies 110 and an AC output 121 connected to conductors 118 coupled to the AC outputs of the power UPS assemblies 110.

The UPS assemblies 110 are configured to be coupled to an AC source and a DC source (e.g., a battery) and to selectively produce an AC output therefrom. Each UPS assembly 110 includes multiple converter modules 114, here shown as each having an on-line topology including rectifier, inverter and battery interface circuitry, connections to which are controlled by contactors K1, K2, K3. It will be appreciated that the converter configuration illustrated for the converter modules 114 is provided for purposes of illustration, and that other configurations may be used in some embodiments.

AC inputs, AC outputs and DC ports of the one or more converter modules 114 are connected in parallel to an interconnection module 112. The interconnection module 112 is configured to control connection of the converter modules 114 to the AC input 121 and the AC output 122 of the distribution assembly 120. In the illustrated embodiments, the interconnection modules 112 include respective circuit breakers CB1, CB3 for the AC inputs and AC outputs, respectively. The circuit breakers CB1, CB3 may be used, for example, to disconnect the converter modules 114 in the event of failure and/or for scheduled maintenance and/or replacement of the converter modules 114.

Figure 2:
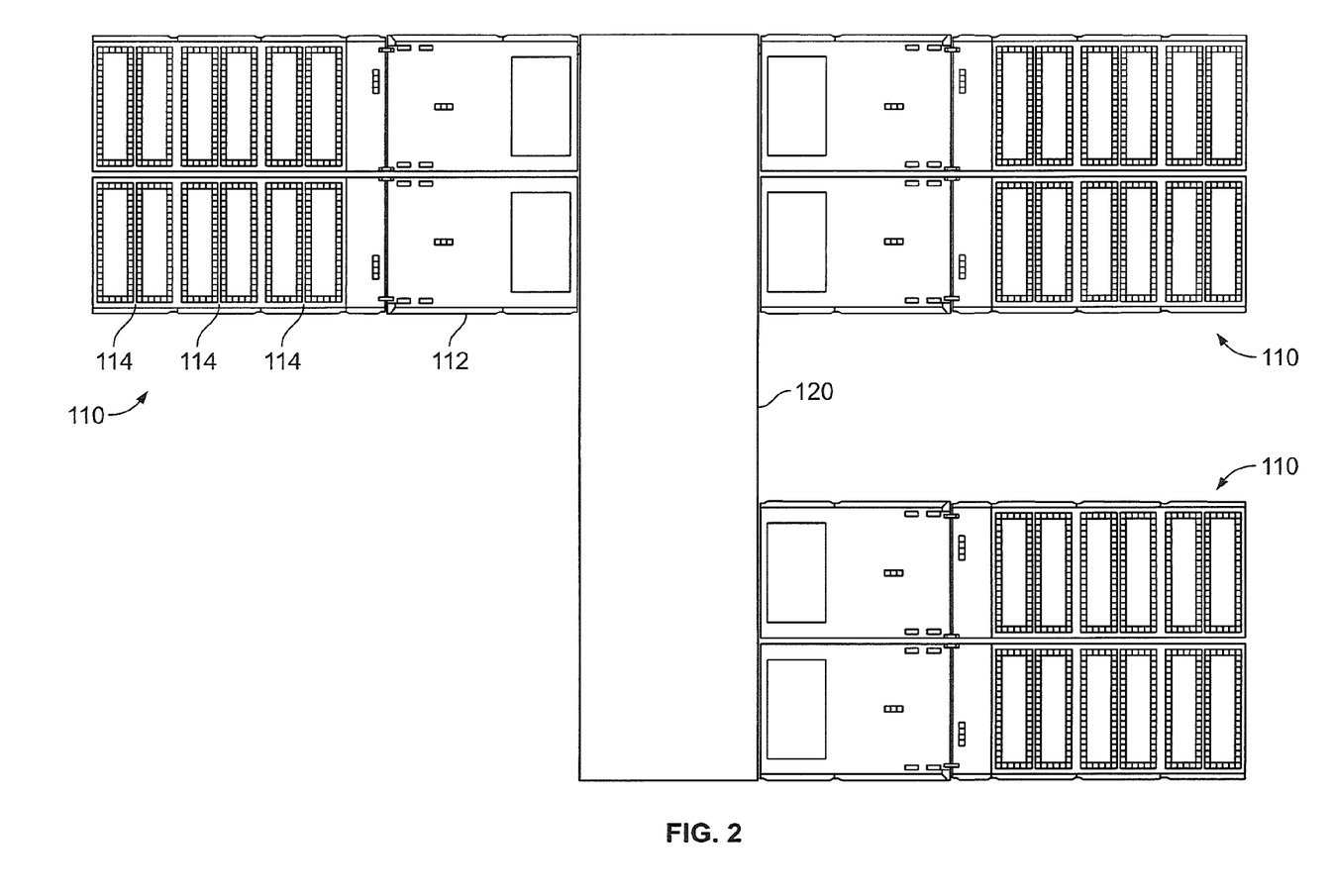
FIG. 2 is a plan view of the UPS system of FIG. 1.

FIG. 2 is a plan view illustrating a physical arrangement of the UPS system of FIG. 1. The UPS assemblies 110 and the distribution assembly 120 each have a generally cubiform shape, and may include one or more cabinets or similar enclosures. The distribution assembly 120 has an elongated rectangular footprint, and multiple UPS assemblies 110 are disposed against sides of the distribution assembly 120 and extend perpendicularly therefrom on opposite sides of the distribution assembly 120. Side faces of the distribution assembly 120 and the UPS assemblies 110 are configured to physically abut one another, with interconnecting conductors passing through confronting side faces of the distribution assembly 120 and the individual UPS assemblies. The UPS assemblies 110 may, for example, be affixed to the distribution assembly 120 using, for example, bolts or other fasteners. In some embodiments, the UPS assemblies 110 and the distribution assembly 120 may be maintained in close proximity to one another by fixed floor mountings or similar means.

The configuration shown in FIG. 2 enables interconnection of the distribution assembly 120 and the UPS assemblies 110 without the use of AC wiring outside of a volume defined by the abutting distribution and UPS assemblies 110, 120, such as interconnecting conduit runs, cable tray runs or the like, as conductors can be retained within the volume enclosed by the combination of the UPS assemblies 110 and the distribution assembly 120. The conductors 116, 118 passing between the distribution assembly 120 and the UPS assemblies 110 may take the form of, for example, cables and/or rigid conductors, such as bus bars.

Figure 3:
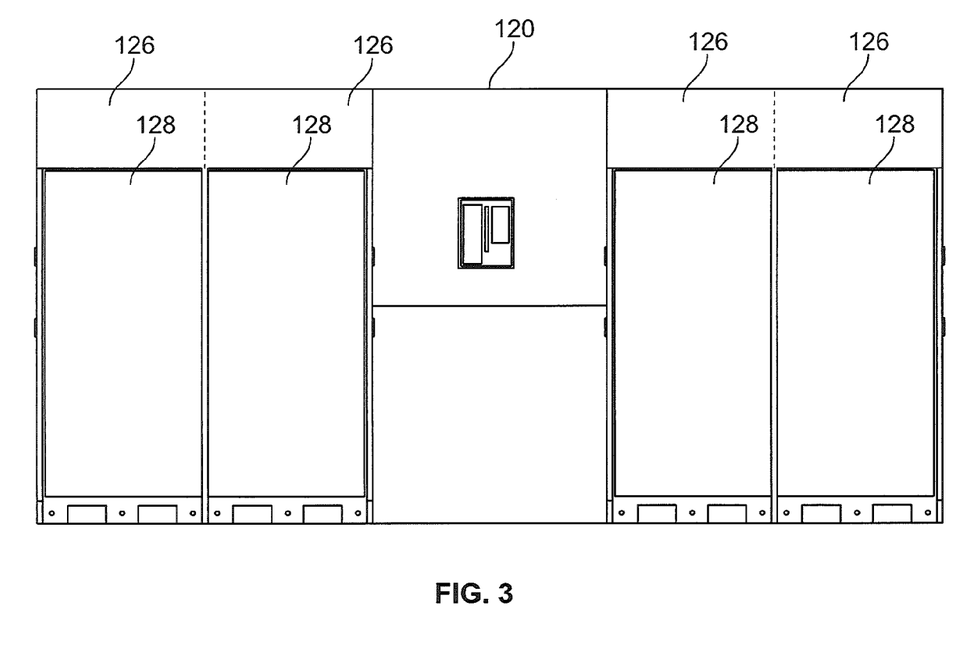
FIG. 3 is a side elevation of a distribution assembly of the UPS system of FIG. 1.
Figure 4:
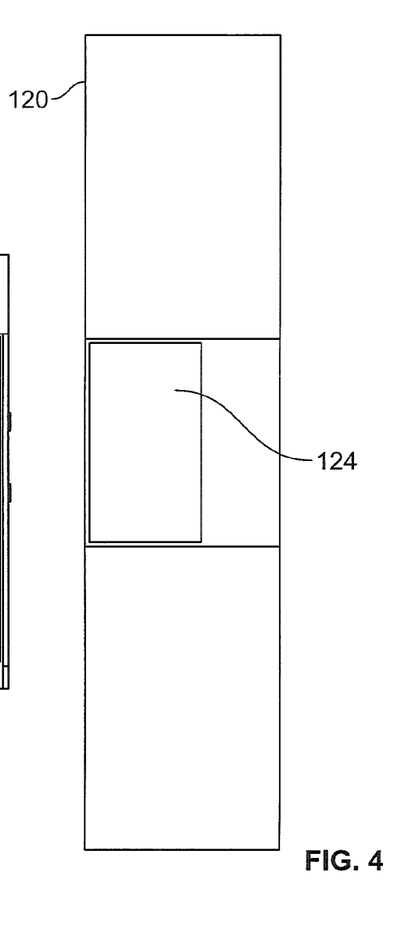
FIG. 4 is a plan view of the distribution section of FIG. 3.
Figure 6:
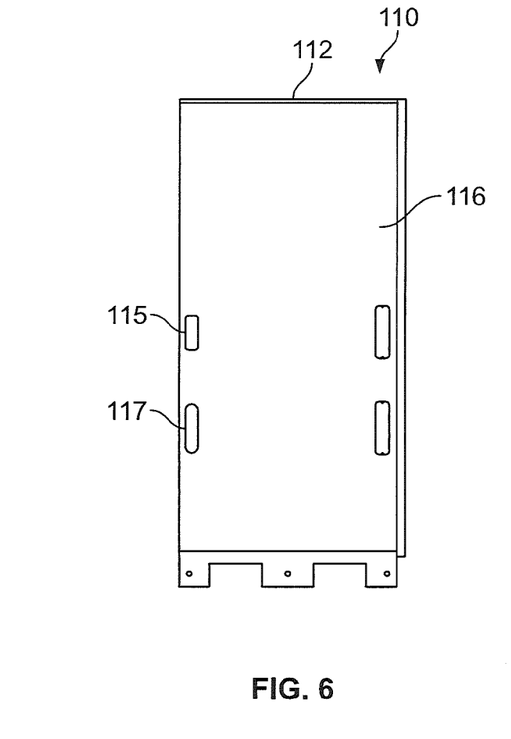
FIG. 6 is a side elevation of the UPS assembly of the UPS system of FIG. 1.

Referring to FIGS. 3 and 6, the distribution assembly 120 includes side faces 126 that are configured to confront matching side faces 116 of the UPS assemblies 110, such that interconnecting conductors (e.g., cables and/or bus bars) may pass through the confronting faces, for example, through openings 115, 117 in the side face 116 of the UPS assembly 110 and openings 128 in a matching side face 126 of the distribution assembly 120. As shown in FIG. 4, the distribution assembly 120 may include one or more openings 124 positioned at a top and/or bottom face thereof and configured to provide passage for input and AC conductors from an AC source (e.g., a utility source or generator) for connection to the AC input 121 and for passage of AC conductors for a load (e.g., a distribution panel) to the AC output 122 of the distribution assembly 120.

Figure 5:
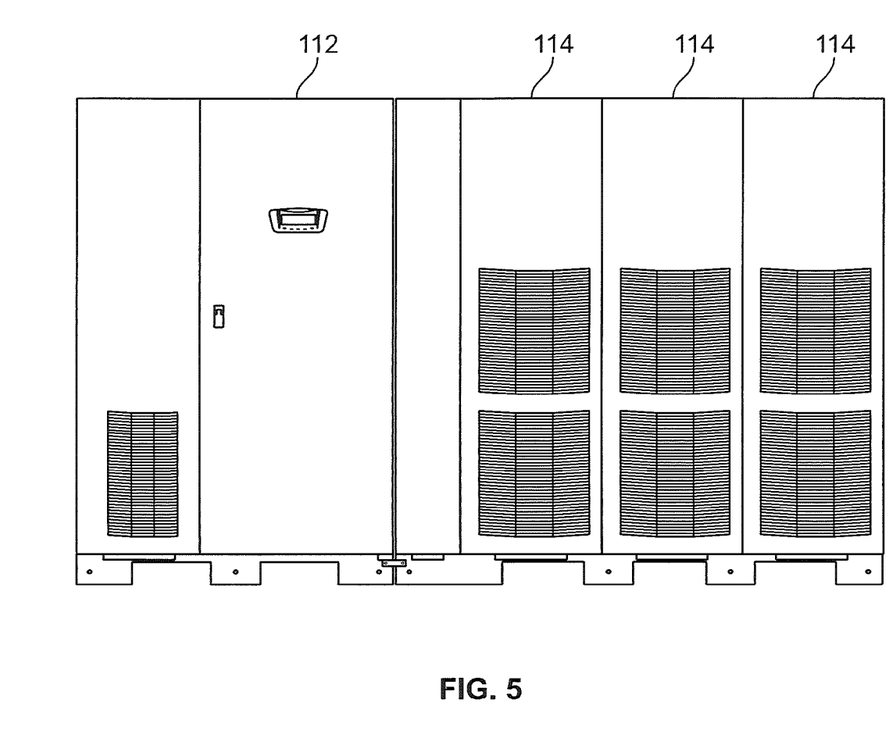
FIG. 5 is a side elevation of a UPS assembly of the UPS system of FIG. 1.

FIG. 5 is a side elevation of a UPS assembly 110, illustrating an exemplary arrangement of converter modules 114 and an interconnection module 112. In the illustrated embodiments, the UPS assembly 110 is configured to abut the distribution assembly 120 at a side proximate the interconnection module 112. However, it will be understood that, in some embodiments, a different arrangement of the interconnection module 112 and the converter modules 114 may be used. It will also be appreciated that, although FIGS. 1, 2 and 5 illustrate UPS modules 110 having three converter modules 114, other embodiments may use UPS assemblies 110 having lesser or greater numbers of converter modules 114. In further embodiments, the UPS assemblies 110 may include additional types of modules or components, such as one or more communications modules.

As noted above, the distribution assembly 120 illustrated in FIGS. 1-4 provides a common AC input 121 and a common AC output 122 for the UPS assemblies 110. In some embodiments, the distribution assembly 120 may include additional components. For example, the distribution assembly 120 may include a static bypass switch and/or a maintenance bypass switch to enable automatic and/or manual bypass of the UPS assemblies 110. The distribution assembly 120 may also include monitoring circuitry, communications circuitry, displays and the like. Some or all of these and other components may be integrated in a single assembly and/or the distribution assembly 120 may have a modular construction that allows such components to be added as desired, such as by adding cabinets or other enclosures.

The architecture of the UPS system illustrated in FIGS. 2-6 offers several potential advantages. The UPS system has a physical arrangement which allows for relatively easy expansion. For example, the number of UPS assemblies 110 and/or or the number of converter modules 114 within a UPS assembly 110 may be varied to provide a desired capacity, without requiring addition of and/or modification of conduit or cable tray runs between the assemblies. Because of the ability to consolidate interconnection of AC source and load in the distribution assembly 120, a customer installing the UPS system may not need to provide additional conduit or wiring for AC connections for the UPS assemblies 110. In addition, the centralization of connections in the distribution assembly 120 may simplify connections for initial installation of the UPS system in comparison to conventional systems.

Figure 7:
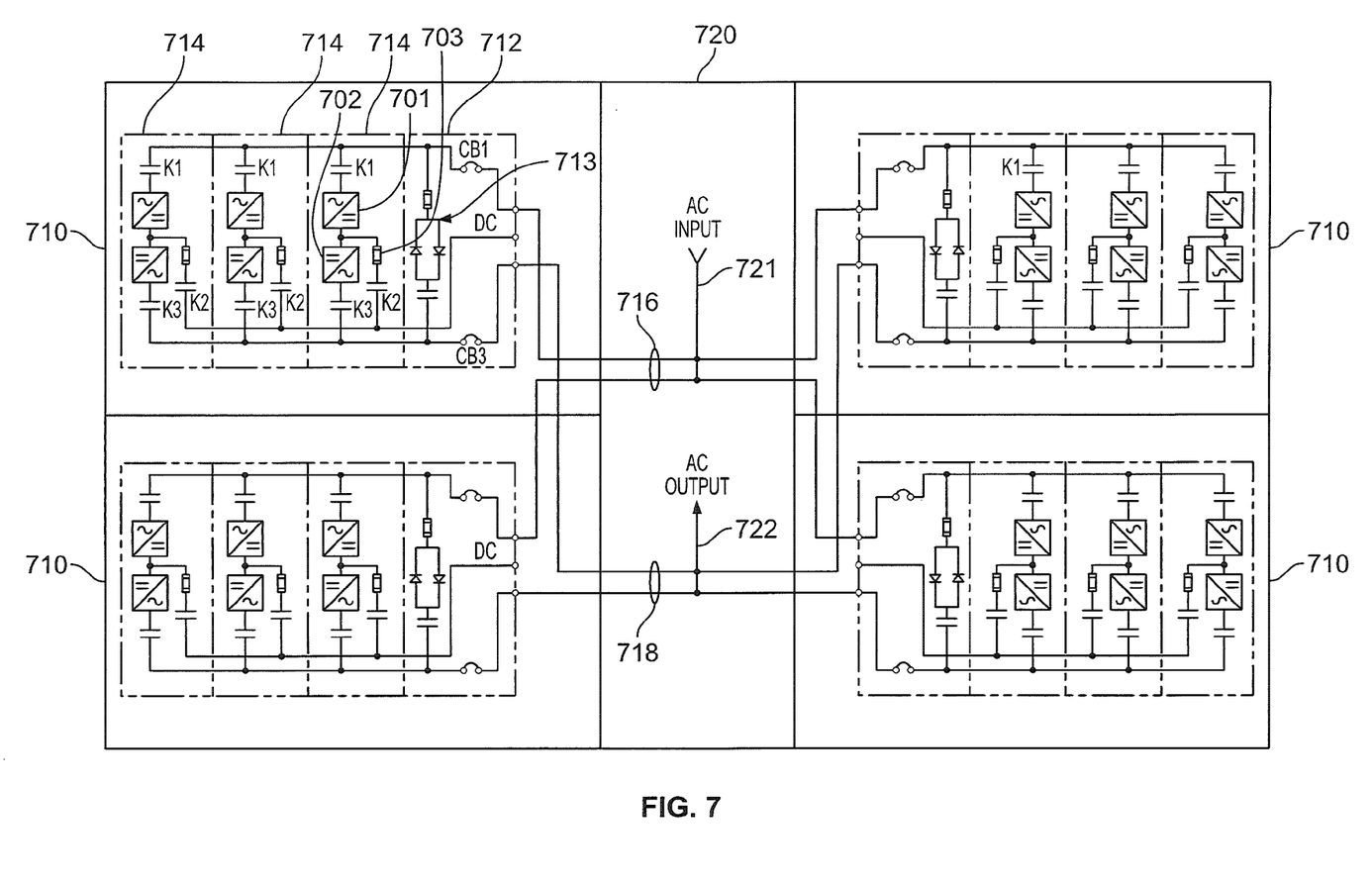
FIG. 7 is a schematic diagram illustrating a UPS system according to further embodiments of the inventive subject matter.

Some embodiments of the inventive subject matter may be particularly advantageous for implementing a distributed bypass arrangement in a UPS system. FIG. 7 is a schematic diagram of a UPS system according to some embodiments of the inventive subject matter. The UPS system includes one or more UPS assemblies 710 coupled to a distribution assembly 720. The UPS assemblies 710 and the distribution assembly 720 each have a generally cubiform shape, and may include one or more cabinets or similar enclosures.

Each UPS assembly 710 includes converter modules 714, here shown as each having an on-line topology including a rectifier, inverter and battery interface, connections to which are controlled by contactors K1, K2, K3, similar to the converter modules 114 of FIG. 1. AC inputs, AC outputs and DC ports of the one or more converter modules 114 are coupled in parallel. Each UPS assembly 710 further includes an interconnection module 712 configured to control connections of the AC inputs and AC outputs of the converter modules 714 to the distribution assembly 720. Similar to the interconnection modules 112 of FIG. 1, the interconnection modules 712 include circuit breakers CB1, CB3 for the AC inputs and outputs, respectively. In contrast to the interconnection modules 112, however, the interconnection modules 712 further include respective static bypass switches 713, each of which is configured to bypass the converter modules 714 within the corresponding UPS assembly 710. The distribution assembly 720 is configured to provide an AC input 721 connected to conductors 716 coupled to the AC inputs of the power UPS assemblies 710 and an AC output 722 connected to conductors 718 coupled to the AC outputs of the power UPS assemblies 710.

Figure 8:
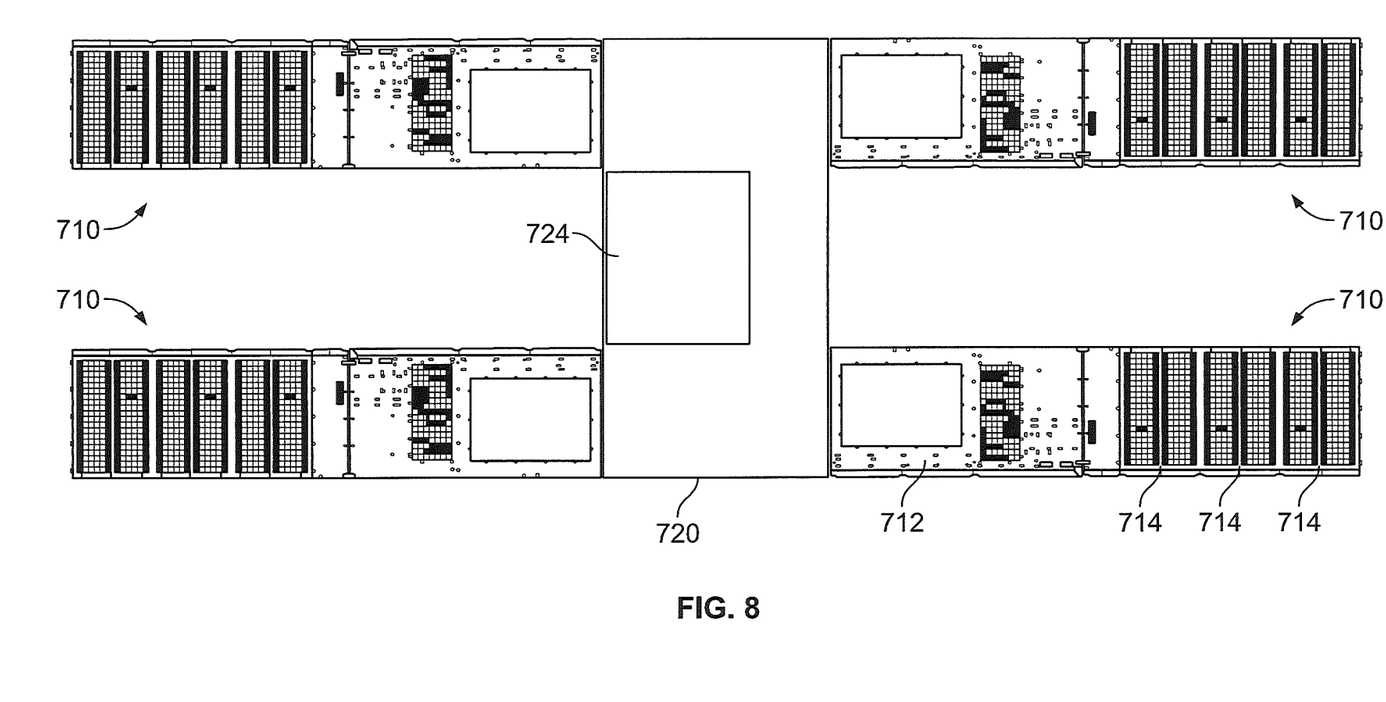
FIG. 8 is a plan view of the UPS system of FIG. 7.

FIG. 8 is a plan view illustrating a physical arrangement of the UPS system of FIG. 7. The UPS assemblies 710 and the distribution assembly 720 are implemented as assemblies having a generally cubiform shape and may include, for example, one or more cabinet-like enclosures. Side faces of the distribution assembly 720 and the UPS assemblies 710 are configured to confront one another, with interconnecting conductors passing through the confronting side faces such that interconnection of the distribution assembly 720 and the UPS assemblies 710 does not require the use of conduit runs, cable tray runs or the like. The conductors passing between the distribution assembly 720 and the UPS assemblies 710 may take the form, for example, of cables and/or rigid conductors, such as bus bars. As shown in FIG. 8, the distribution assembly 720 may have an elongated rectangular footprint, and multiple UPS assemblies 710 may be positioned against the distribution assembly 720 and extend perpendicularly therefrom on opposite sides of the distribution assembly 720.

Figure 9:
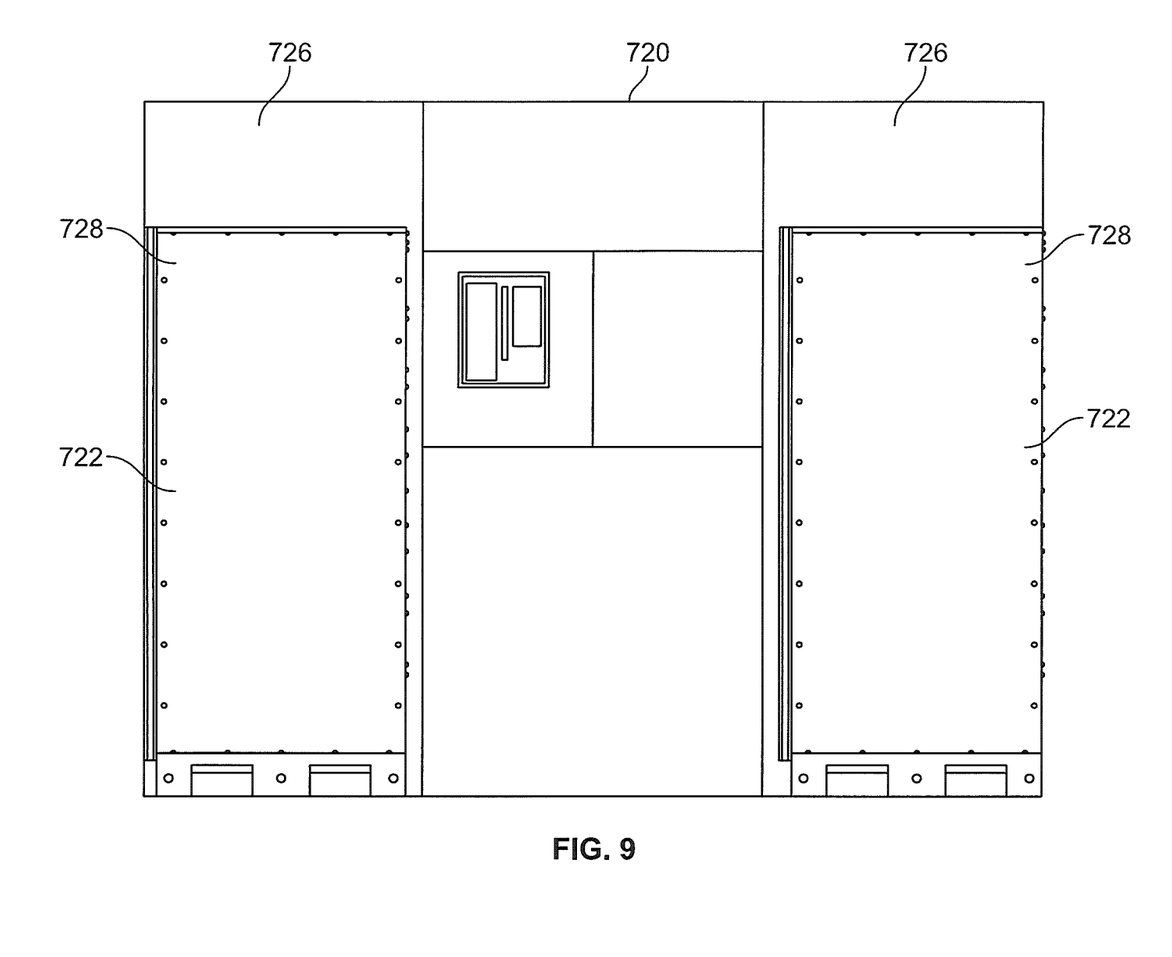
FIG. 9 is a side elevation of a distribution assembly of the UPS system of FIG. 7.
Figure 11:
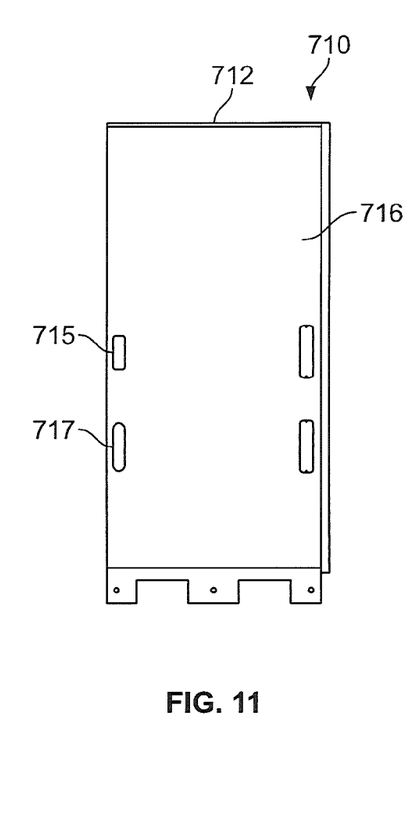
FIG. 11 is a side elevation of the UPS assembly of the UPS system of FIG. 7.

Referring to FIGS. 9 and 11, the distribution assembly 720 includes side faces 726 that are configured to confront matching side faces 716 of the UPS assemblies 710, such that conductor cables or busses may pass through the confronting faces, for example, through openings 715, 717 in the side face 716 of the UPS assembly 710 and openings 728 in a matching side face 726 of the distribution assembly 720. Referring to FIG. 8, the distribution assembly 720 may include one or more openings 724 on a top and/or bottom face thereof and configured to provide passage for AC source and load conductors for connection to the AC input 721 and the AC output 722, respectively.

Figure 10:
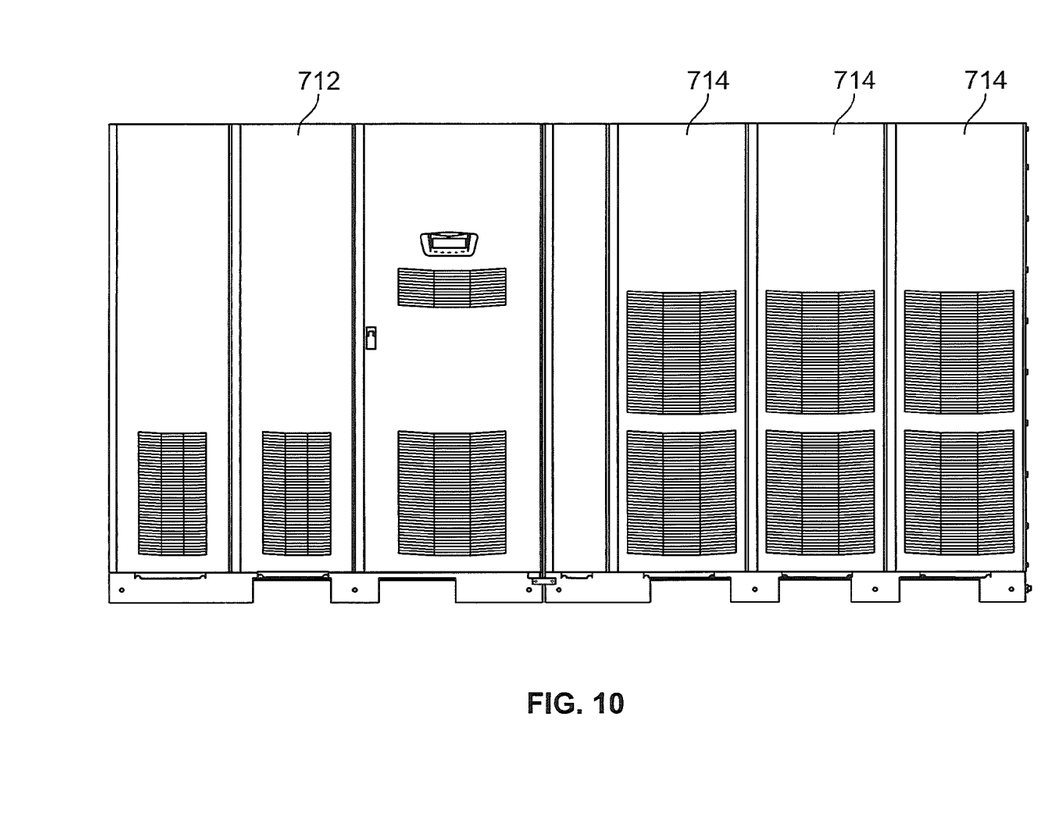
FIG. 10 is a side elevation of a UPS assembly of the UPS system of FIG. 7.

FIG. 10 is a side elevation of a UPS assembly 710, illustrating an exemplary arrangement of converter modules 714 and an interconnection module 712. In the illustrated embodiments, the UPS assembly 710 is configured to abut the distribution assembly 720 at a side proximate the interconnection module 712. However, it will be understood that, in some embodiments, a different arrangement of the interconnection module 712 and converter modules 714 may be used. It will also be appreciated that, although FIGS. 7, 8, and 10 illustrate UPS modules 710 having three converter modules 714, other embodiments may use lesser or greater numbers of converter modules 714. In further embodiments, the UPS assemblies 710 may include additional modules or components, such as one or more communications modules.

In some embodiments, the distribution assembly 720 may also include additional components, such as a maintenance bypass switch to enable manual bypass of the converter circuitry in the UPS assemblies 710. The distribution assembly 720 may also include monitoring circuitry, communications circuitry, displays and the like. Some or all of these and other components may be integrated in a single assembly and/or the distribution assembly 720 may have a modular construction that allows such components to be added as desired.

The arrangement illustrated in FIGS. 8-11 may be particular advantageous over conventional arrangements that with wiring arrangements using conduit runs, cable trays or the like. In particular, in a distributed bypass circuit implementation such as that shown in FIG. 7, it may be desirable that conductor runs to each of the UPS assemblies 710 be approximately the same length. Because of the symmetry of the modular architecture shown in FIGS. 8-11, this goal may be more easily achieved.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. A UPS system comprising:
  a cubiform power distribution assembly having a plurality of side faces and comprising an AC input and an AC output; and
  at least two uninterruptible power supply (UPS) assemblies positioned outside of the power distribution assembly on respective different sides of the power distribution assembly and having respective side faces confronting respective ones of the side faces of the power distribution assembly, each of the at least two UPS assemblies comprising a plurality of converter modules and an interconnection module configured to switchably couple AC inputs and AC outputs of the converter modules to respective ones of the AC input and the AC output of the power distribution assembly through conductors passing through the confronting side faces.

2. The system of claim 1, wherein the at least two UPS assemblies are positioned against at least one side of the power distribution assembly.

3. The system of claim 1, wherein the conductors couple the power distribution assembly to the at least two UPS modules without the use of AC wiring external to a volume defined by the distribution assembly and the at least two UPS assemblies.

4. The system of claim 1, wherein the at least two UPS assemblies are cubiform in shape.

5. The system of claim 4, where the at least two UPS assemblies comprise first and second UPS assemblies that extend perpendicularly from respective opposite sides of the power distribution assembly.

6. The system of claim 5, wherein the at least two UPS assemblies comprises first and second pairs of UPS assemblies extending from respective opposite sides of the power distribution assembly.

7. The system of claim 1, wherein each converter module comprises a rectifier circuit and an inverter circuit coupled to the AC input and the AC output, respectively, of the converter module.

8. The system of claim 1, wherein each interconnection module comprises respective first and second circuit breakers configured to switchably couple the AC inputs and AC outputs of the associated converter modules to respective ones of the AC input and the AC output of the power distribution assembly.

9. The system of claim 1, wherein the interconnection modules of the at least two UPS assemblies each comprise a static bypass switch.

10. An apparatus comprising:
a cubiform power distribution assembly comprising an AC input, an AC output and at least two side faces configured to confront side faces of respective ones of at least two UPS assemblies positioned outside of the power distribution assembly on respective different sides of the power distribution assembly, the power distribution assembly further configured to couple the AC input and the AC output to the at least two UPS modules through the confronting faces.

11. The apparatus of claim 10, wherein the power distribution assembly is configured to couple the AC input and the AC output to the at least two UPS modules using conductors passing through the confronting faces.

12. The apparatus of claim 10, where the at least two side faces of the power distribution assembly are configured such that the at least two UPS assemblies comprises first and second UPS assemblies that extend perpendicularly from respective opposite sides of the power distribution assembly.

13. The apparatus of claim 12, wherein the at least two side faces of the power distribution assembly comprise at least two pairs of side faces configured to confront at least two pairs of UPS assemblies on opposite sides of the power distribution assembly.

14. A UPS system comprising:
a power distribution assembly comprising at least one cubiform enclosure having a plurality of side faces; and
at least two UPS assemblies positioned outside of the power distribution assembly on respective different sides of the power distribution assembly, each of the at least two UPS assemblies comprising at least one cubiform enclosure having a side face configured to confront a side face of the power distribution assembly, a plurality of converter modules and an interconnection module configured to switchably couple AC inputs and AC outputs of the converter modules to respective ones of an AC input and an AC output of the power distribution assembly through conductors passing through the confronting side faces.

15. The system of claim 14, wherein the distribution assembly and the at least two UPS assemblies are configured to support AC connection of the distribution assembly to the at least two UPS assemblies without the use of wiring external to a volume defined by a combination of the distribution assembly and the at least two UPS assemblies.

16. The system of claim 14, wherein each converter module comprises a rectifier circuit and an inverter circuit.

17. The system of claim 14, wherein each interconnection module comprises respective first and second circuit breakers configured to switchably couple the AC inputs and AC outputs of the associated converter modules to respective ones of the AC input and the AC output of the power distribution assembly.

18. The system of claim 14, wherein the interconnection modules of the at least two UPS assemblies each comprise a static bypass switch.

* * * * *